United States Patent
Bruekers et al.

(10) Patent No.: US 7,028,249 B2
(45) Date of Patent: Apr. 11, 2006

(54) METHOD AND APPARATUS FOR PROTECTING LOSSLESS TRANSMISSION OF A DATA STREAM

(75) Inventors: Alphons Antonius Maria Lambertus Bruekers, Eindhoven (NL); Adriaan Johannes Rijnberg, Eindhoven (NL); Bernard Van Steenbrugge, Eindhoven (NL); Marcel Stefan Emmanuel Van Nieuwenhoven, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 388 days.

(21) Appl. No.: 10/046,991

(22) Filed: Jan. 15, 2002

(65) Prior Publication Data
US 2002/0133780 A1 Sep. 19, 2002

(30) Foreign Application Priority Data
Jan. 17, 2001 (EP) .................................. 01200165

(51) Int. Cl.
*G06F 11/10* (2006.01)
*H03M 13/00* (2006.01)
(52) U.S. Cl. ...................................... 714/807; 714/758
(58) Field of Classification Search ................ 714/752, 714/758, 704, 786, 807
See application file for complete search history.

(56) References Cited

U.S. PATENT DOCUMENTS

| 5,341,384 A | | 8/1994 | Miya et al. .................. 714/747 |
| 5,592,487 A | * | 1/1997 | Knecht et al. ............... 370/473 |
| 5,875,202 A | * | 2/1999 | Venters et al. .............. 714/807 |
| 6,178,535 B1 | * | 1/2001 | Kajala et al. ................ 714/752 |
| 6,578,162 B1 | * | 6/2003 | Yung .......................... 714/708 |
| 6,658,378 B1 | * | 12/2003 | Maeda ..................... 704/200.1 |

OTHER PUBLICATIONS

F. Bruekers et al., "Improved Lossless Coding of 1-bit Audio Signals", $103^{rd}$ Convention of the AES, Sep. 1997, preprint 4563.

* cited by examiner

*Primary Examiner*—Shelly Chase
(74) *Attorney, Agent, or Firm*—Larry Liberchuk

(57) ABSTRACT

A method and apparatus for encoding an input digital signal for lossless transmission comprising first calculation means for calculating a checksum of the input digital signal. The apparatus further comprises encoding means for lossless encoding into an encoded packet of digital data, and composition means for adding the associated checksum to the encoded packet to form an encoded signal. Associated are a method and apparatus for decoding the encoded signal, comprising extracting means for receiving the encoded signal and extracting the encoded packet and associated checksum, decoding means for decoding the encoded packet into a decoded packet comprising the input digital signal, second calculation means for calculating a checksum for the decoded packet, and output means for outputting the decoded packet as an output signal if the calculated checksum corresponds with the extracted checksum.

19 Claims, 2 Drawing Sheets

METHOD AND APPARATUS FOR PROTECTING LOSSLESS TRANSMISSION OF A DATA STREAM

Figure 1:
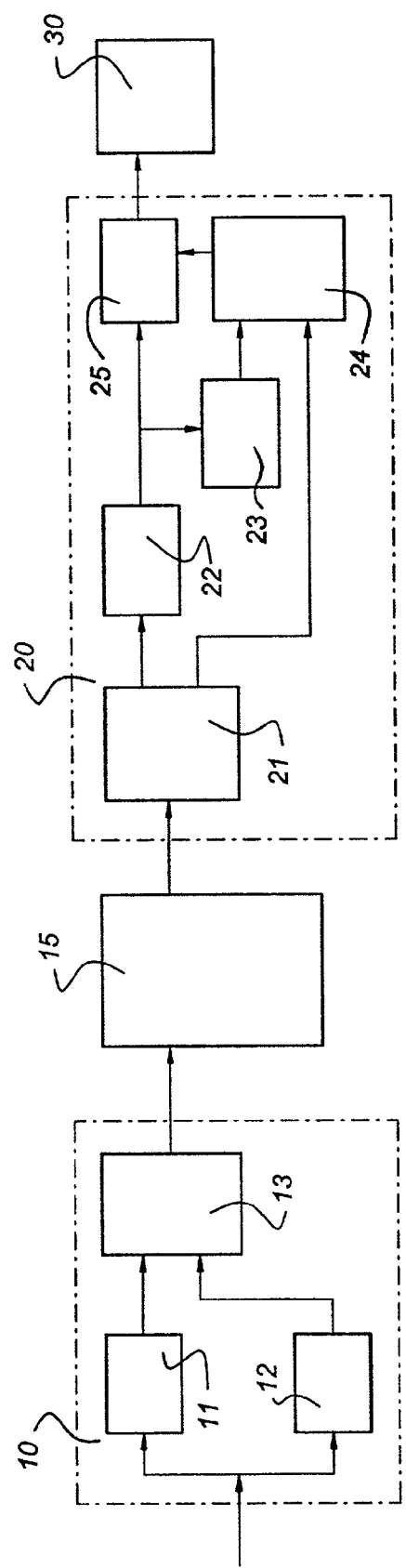

The present invention relates to a method and apparatus for protecting lossless transmission of a data stream. More specifically, the present invention relates to a method of encoding an input digital signal for lossless transmission via a medium, the method comprising the steps of receiving the input digital signal comprising at least one packet of digital data, and calculating a checksum of the at least one packet of the input digital signal.

Such a method is known from United States patent U.S. Pat. No. 5,341,384, which describes an error detection method using CRC in digital communication of a speech signal. From an input digital signal, a checksum (CRC) is calculated and added to the signal. Then, the composed signal is encoded to enable error correction for transmission over a communication medium. After reception of the signal, the signal is decoded and checked on errors and checked on the checksum. When an error is detected, or when the checksum control fails, the signal is interpolated or muted, so that an error is not decoded into speech.

This known method has the disadvantage that the reception and further processing requires the error detection and checksum monitoring to be present at all times. This is caused by the fact that in the known method first a checksum is calculated and added to the signal and that, subsequently, an error correction code is calculated over the complete composed signal. Earlier equipment not provided with the error detection and checksum monitoring are unable to properly transform the received signal into the original signal.

Therefore, the present invention seeks to provide a method and apparatus for protecting a lossless transmission of a data stream by encoding and decoding a digital data signal, able to provide an output digital signal which is equal to the input digital signal, which also allows backwards compatibility with former systems not using the protection scheme.

The present invention provides, in a first aspect, a method of the type defined in the preamble, comprising the further steps of encoding the packet of the input signal into an encoded packet of digital data, and adding the associated checksum to the encoded packet to form an encoded signal. Preferably, the associated checksum is a cyclic redundancy checksum (CRC) and is preferably added to the encoded packet as a separate packet.

The method according to the present invention, provides protection over the complete path from input digital signal to output digital signal for all data comprised in data packets of the data stream. The present method assures that the output signal of the decoder is equal to the input signal of the encoder, regardless whether the decoder is equipped with the checksum monitoring or not. Therefore, the present method is backwards compatible with audio equipment not using the checksum monitoring.

Furthermore, the present invention provides a method of decoding an encoded signal obtained by the encoding method according to the present invention, comprising the steps of receiving the encoded signal, extracting the encoded packet and associated checksum from the received encoded signal, decoding the encoded packet into a decoded packet comprising the input digital signal, calculating a checksum for the decoded packet and, if the calculated checksum corresponds with the extracted checksum, outputting the decoded packet as an output signal. This decoding method provides the end-to-end protection in the lossless transmission of the data stream. The end-to-end protection is able to test the implementation of the decoder (hardware or software implementation). When the implementation is incorrect, no output signal will result.

In a further embodiment of the present method, the method comprises the further step of channel encoding, to enable a lossless transmission via the medium. Also, the decoding method then comprises the further step of channel decoding before the step of receiving the encoded signal, to enable a lossless transmission via the medium. It is possible that the channel encoding/decoding step performs a faulty error correction, which would lead to a faulty data packet, with the same consequences as stated above. The present method will detect such a faulty channel decoding.

Preferably, the method comprises the further step of interpolating or muting the decoded packet if the calculated checksum and the extracted checksum are unequal. Errors in the decoding step may result in faulty data packets, which in audio applications may lead to damage to output processing systems (output gates or loudspeakers), or may even cause nuisance or hearing damage to listeners. The present invention allows to detect and subsequently interpolate or mute faulty packets, and thus provides a more robust method for data stream encoding and decoding.

In a further aspect, the present invention provides an apparatus for encoding an input digital signal comprising at least one packet of digital data for lossless transmission via a medium, the apparatus comprising first calculation means for calculating a checksum of the at least one packet of the input digital signal, such as known from U.S. Pat. No. 5,341,384. According to the present invention, the apparatus further comprises encoding means for lossless encoding of the at least one packet into an encoded packet of digital data, and composition means connected to the calculation means and encoding means for adding the associated checksum to the encoded packet to form an encoded signal. Preferably, the checksum is a cyclic redundancy checksum and, preferably, the associated checksum is added to the encoded packet as a separate packet.

Associated with the encoding apparatus is a decoding apparatus for decoding an encoded signal obtained from the encoding apparatus according to the present invention, comprising extracting means for receiving the encoded signal and extracting the encoded packet and associated checksum from the received encoded signal, decoding means connected to the extracting means for decoding the encoded packet into a decoded packet comprising the input digital signal, second calculation means connected to the decoding means for calculating a checksum for the decoded packet, and output means connected to the extracting means, the second calculation means and the decoding means for outputting the decoded packet as an output signal if the calculated checksum corresponds with the extracted checksum.

Preferably, the output means are further arranged for interpolating or muting the decoded packet if the calculated checksum and the extracted checksum are unequal.

In a further embodiment, the encoding apparatus further comprises channel encoding means connected to the composition means and being arranged to enable a lossless transmission via the medium, and the decoding apparatus further comprises channel decoding means connected to the extracting means, the channel decoding means being arranged to enable a lossless transmission via the medium.

The encoding and decoding apparatus provide comparable advantages to the method according to the present invention above.

In still further aspects, the present invention relates to a signal comprising at least a packet of a first type and a packet of a second type, obtained by the encoding method according to the present invention and to a storage medium comprising a signal according to the present invention.

Figure 2:
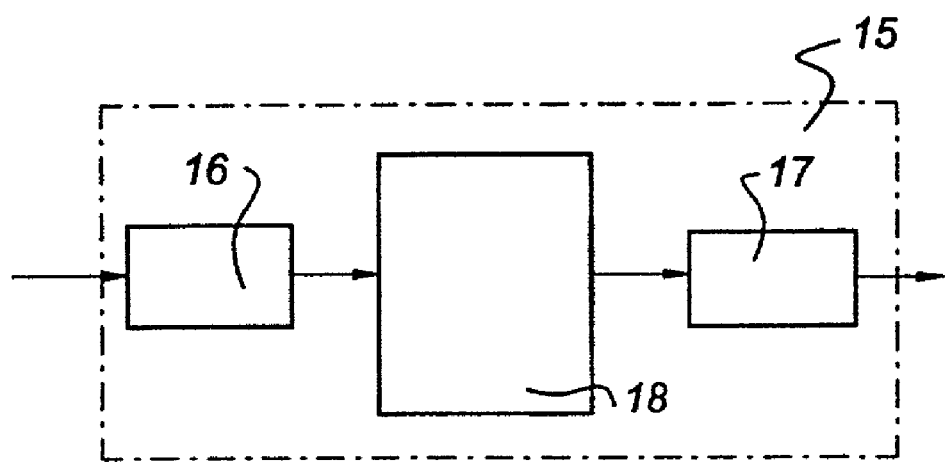

The present invention will now be discussed in more detail using a number of exemplary embodiments of the present invention, with reference to the accompanying drawings, in which:

FIG. 1 shows a schematic diagram for an encoding and decoding apparatus according to an embodiment of the present invention; and FIG. 2 shows a schematic diagram of a lossless transmission medium used in the present invention.

The present invention will be discussed in more detail by describing the coding and decoding process of a digital audio signal for a Super Audio Compact Disc (SACD).

A sound signal is converted into a digital signal using the Direct Stream Digital (DSD) standard used in e.g. super audio compact disc technology. The DSD signal is a one-bit audio signal, and may comprise a number of multiplexed audio channels, each audio channel being intended for one loudspeaker. At present, the number of audio signals may range from two (normal stereo) to six (ITU-R BS.775 5-channel surround set-up plus additional low frequency enhancement loudspeaker).

The digital signal comprises a number of sectors, which may comprise an audio header and a number of (multiplexed) data packets, where the audio header comprises information on the data packets in the sector and on frames that start in the sector. Each data packet may comprise audio data, supplementary data, audio information data or padding data. An integer number of packets form a multiplexed frame, having a time length of 1/75th of a second, and a time code expressed in minutes, seconds and frames.

According to the super audio CD (SACD) standard being developed, a lossless coding technique is being used to encode the DSD signal before storage (e.g. on a SACD), called Direct Stream Transfer (DST). This lossless coding technique is described in F. Bruekers et al., "Improved lossless coding of 1-bit audio signals", presented at the 103rd Convention of the AES, Sep. 26–29, 1997, preprint 4563 (I-6). This lossless coding technique allows inter alia to improve the dynamic range of the digital signal and compression of data allowing more data to be stored on the medium.

FIG. 1 shows a schematic diagram of an embodiment of the present invention, comprising an encoder device 10 and a decoder device 20. In the schematic diagram, only the elements relevant to this invention are shown and discussed herein, the other elements found in actual systems (such as SACD recorders and players) are left out for reasons of clarity.

A DSD signal is being input to the encoder device 10 for encoding and transmission via a transport medium 15, such as a transmission line or recording medium, such as a SACD or DVD disc. The decoder device 20 receives the encoded signal from the transport medium 15, decodes the encoded signal and outputs a decoded signal to an output device 30, which is arranged to further process this output signal to produce an audio signal in a manner known to the person skilled in the art.

When the recovered output signal is corrupted, i.e. comprises errors in comparison with the input signal of the encoder device 10, the result may be that the output device 30, or parts thereof such as output stages or loudspeakers, may be damaged. Also, the corrupted output signal may, when transformed into an audio signal, be hazardous to the human hearing.

The encoder device 10 comprises a DST encoder device 11, which receives the input DSD signal and performs the DST encoding function for each DSD signal audio packet. Also the encoder device 10 comprises a checksum calculating element 12, which also receives the input DSD signal. Synchronous with the DST encoding, the checksum calculating element 12 calculates a checksum (such as a cyclic redundancy checksum, CRC) from the DSD signal audio packet. The output signals of the DST encoder element 11 and checksum calculating element 12 are combined in the combination element 13.

In an embodiment, the checksum calculating element 12 preferably calculates the checksum (CRC(x)) of the DSD signal audio packet according to the following equations:

$$CRC(x) = \sum_{i=31}^{0} b_i x^i = I(x) \bmod G(x), \text{ where}$$

$$I(x) = \sum_{i=8*4704*N\_Channels+32-1}^{32} b_i x^i, \text{ and } G(x) = x^{32} + x^{31} + x^4 + 1$$

The combination element 13 adds the checksum as a separate packet in the digital data stream. Preferably, the checksum is included in an audio info packet, which is included in the encoded audio packet in the same multiplexed frame. Including the checksum in an additional audio info packet has the advantage that the signal is backwards compatible with decoding equipment not arranged to extract the checksum information.

The decoder device 20 comprises extracting element 21 for recovering the encoded signal from the medium 15 and for extracting the audio packets and associated audio info packets from the multiplexed frames in the encoded signal. The extracted audio packets are input into a DST decoder 22, which decodes the DST encoded information into the original DSD format digital input signal. The decoded signal packet is then input to a checksum calculating device 23 for the decoded signal, and the resulting checksum is compared to the extracted checksum in comparator 24. The comparator 24 is controlling a switch or gate 25, which allows the decoded audio packet to be output to the output device 30 when the extracted checksum and calculated checksum correspond. When the extracted checksum and calculated checksum do not correspond, the gate 25 is prevented from outputting the (faulty) packet, thus preventing possible damage to the output stage or loudspeaker of the output device or equipment 30 which uses the output signal of the decoder device 20. Preferably, the equipment 30 which uses the output signal of the decoder device 20 is arranged to mute or interpolate the output signal when a specific packet is blocked. Alternatively, this muting or interpolation function may be implemented in the switch or gate 25.

The encoded signal is transmitted via the transport medium 15 (transmission line, e.g. Internet, or (super audio) compact disc storage) to the decoder device 20. The medium 15 may be a simple transmission line or a storage element. In an alternative embodiment, the transport medium 15 is a medium 18, which may introduce errors in the encoded signal. To allow correction of errors, the transport medium 15 comprises a channel coding element 16 and a channel decoding element 17 for allowing error detection and correction of errors introduced by the medium 18. The channel coding element 16, channel decoding element 17, and (error introducing) medium 18 thus form an error free transport medium 15. However, it is still possible that errors which are not (properly) detected and/or corrected by the channel encoding/decoding elements 16, 17 are introduced in the encoded signal by the medium 18. In the embodiment according to the present invention, the use of the checksum allows to detect whether the output digital signal corresponds exactly to the input digital signal. This also allows to detect correct operation of the decoder. When the decoder is implemented incorrectly, this will result in an anomalous output signal. Also defects in components of the decoder, e.g., resulting from ageing. In that case, the decoder will no longer operate correctly, as a result of which the output signal will no longer correspond to the original signal. The introduced errors which might lead to damage to the output stage of the output equipment 30, such as damaged loudspeakers, or damage to the listener's ear, are thus prevented.

In the above discussed illustrative embodiment, the digital input signal described is a DSD signal used in SACD or DVD recording and playing. For the person skilled in the art it will be clear that the present invention may be used for all areas of lossless transmission of data, independent of what the data represents. Besides the already described audio data, the data may comprise pulse code modulation (PCM) data, the transmission of which may be protected by the present invention for all data or only a part of them (e.g. the most significant bits).

The invention claimed is:

1. A method of encoding an input digital signal for lossless transmission via a medium (15), the method comprising the steps of:
   receiving the input digital signal comprising at least one packet of digital data; and
   calculating a checksum of the at least one packet of the input digital signal;
   characterised in that the method comprises the further steps of:
   encoding the packet of the input signal into an encoded packet of digital data; and
   adding the associated checksum to the encoded packet to form an encoded signal,
   wherein the input digital signal is an audio signal conforming to the Direct Stream Digital standard, and the encoding step includes Direct Stream Transfer coding.

2. A method as claimed in claim 1, in which the associated checksum is added to the encoded packet as a separate packet.

3. A method as claimed in claim 1, in which the checksum is a cyclic redundancy checksum.

4. A method as claimed in claim 1, in which the method comprises the further step of channel encoding, to enable a lossless transmission via the medium (15).

5. A signal comprising at least a packet of a first type and a packet of a second type, obtained by the method as claimed in claim 1.

6. A storage medium comprising a signal as claimed in claim 5.

7. A method as claimed in claim 1, in which the checksum adding step includes inserting the checksum as an audio information packet.

8. A method of decoding an encoded signal obtained by calculating a checksum of at least one packet of a input digital signal, encoding the packet of the input signal into an encoded packet of digital data, and adding the associated checksum to the encoded packet to form the encoded signal, comprising the steps of:
   receiving the encoded signal;
   extracting the encoded packet and associated checksum from the received encoded signal;
   decoding the encoded packet into a decoded packet comprising the input digital signal;
   calculating a checksum for the decoded packet; and
   if the calculated checksum corresponds with the extracted checksum, outputting the decoded packet as an output signal,
   wherein the input digital signal is an audio signal conforming to the Direct Stream Digital standard, encoding the packet of the input signal into an encoded packet includes Direct Stream Transfer coding, and decoding the encoded packet into a decoded packet includes Direct Stream Transfer decoding.

9. A method as claimed in claim 8, in which the method comprises the further step of interpolating the decoded packet if the calculated checksum and the extracted checksum are unequal.

10. A method as claimed in claim 8, in which the method comprises the further step of muting the decoded packet if the calculated checksum and the extracted checksum are unequal.

11. A method as claimed in claim 8, wherein the encoded signal has been channel encoded, comprising the further step of channel decoding before the step of receiving the encoded signal, to enable a lossless transmission via the medium (15).

12. An apparatus (10) for encoding an input digital signal comprising at least one packet of digital data for lossless transmission via a medium (15), the apparatus (10) comprising:
   first calculation means (12) for calculating a checksum of the at least one packet of the input digital signal;
   characterised in that the apparatus further comprises:
   encoding means (11) for lossless encoding of the at least one packet into an encoded packet of digital data; and
   composition means (13) connected to the calculation means (12) and encoding means (11) for adding the associated checksum to the encoded packet to form an encoded signal,
   wherein the input digital signal is an audio signal conforming to the Direct Stream Digital standard, and the encoding means includes means for Direct Stream Transfer coding of the at least one packet.

13. An apparatus as claimed in claim 12, in which the composition means (13) are arranged to add the associated checksum to the encoded packet as a separate packet.

14. An apparatus as claimed in claim 12, in which the calculation means (12) are arranged for calculating the checksum as a cyclic redundancy checksum.

15. An apparatus as claimed in claim 12, in which the apparatus further comprises channel encoding means (16) connected to the composition means (13) and being arranged to enable a lossless transmission via the medium (15).

16. An apparatus (20) for decoding an encoded signal obtained by calculating a checksum of at least one packet of a input digital signal, encoding the packet of the input signal into an encoded packet of digital data, and adding the associated checksum to the encoded packet to form the encoded signal, comprising:
   extracting means (21) for receiving the encoded signal and extracting the encoded packet and associated checksum from the received encoded signal;

decoding means (22) connected to the extracting means (21) for decoding the encoded packet into a decoded packet comprising the input digital signal;

second calculation means (23) connected to the decoding means (22) for calculating a checksum for the decoded packet; and output means (24, 25) connected to the extracting means (21), second calculation means (23) and decoding means (22) for outputting the decoded packet as an output signal if the calculated checksum corresponds with the extracted checksums, wherein the input digital signal is an audio signal conforming to the Direct Stream Digital standard, the encoding means includes means for Direct Stream Transfer coding of the at least one packet, and the decoding means includes means for Direct Stream Transfer decoding of the encoded packet.

17. An apparatus as claimed in claim 16, in which the output means (24, 25) are further arranged for interpolating the decoded packet if the calculated checksum and the extracted checksum are unequal.

18. An apparatus as claimed in claim 16, in which the output means (24, 25) are further arranged for muting the decoded packet if the calculated checksum and the extracted checksum are unequal.

19. An apparatus as claimed in claim 16, wherein the encoded signal has been channel encoded, further comprising channel decoding means (17) connected to the extracting means (21), the channel decoding means (17) being arranged to enable a lossless transmission via the medium.

* * * * *